United States Patent
Gaidis

(10) Patent No.: US 7,241,668 B2
(45) Date of Patent: Jul. 10, 2007

(54) PLANAR MAGNETIC TUNNEL JUNCTION SUBSTRATE HAVING RECESSED ALIGNMENT MARKS

(75) Inventor: Michael C. Gaidis, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/560,690

(22) PCT Filed: Jun. 24, 2003

(86) PCT No.: PCT/US03/19773

§ 371 (c)(1), (2), (4) Date: Dec. 13, 2005

(87) PCT Pub. No.: WO2005/010975

PCT Pub. Date: Feb. 3, 2005

(65) Prior Publication Data

US 2006/0141737 A1    Jun. 29, 2006

(51) Int. Cl. H01L 21/44 (2006.01)
(52) U.S. Cl. ............... 438/462; 438/631; 438/672
(58) Field of Classification Search ........ 438/631, 438/672, 462
See application file for complete search history.

(56) References Cited

U.S. PATENT DOCUMENTS

| | | | |
|---|---|---|---|
| 3,887,993 A * | 6/1975 | Okada et al. ............... 438/220 |
| 5,663,099 A | 9/1997 | Okabe et al. |
| 5,899,738 A * | 5/1999 | Wu et al. ................... 438/618 |
| 5,923,996 A | 7/1999 | Shih et al. |
| 5,933,744 A | 8/1999 | Chen et al. |
| 6,020,263 A * | 2/2000 | Shih et al. ................... 438/692 |
| 6,080,636 A | 6/2000 | Tseng |
| 6,140,233 A * | 10/2000 | Kwag et al. ................. 438/669 |
| 6,232,200 B1 | 5/2001 | Chu |
| 6,242,770 B1 | 6/2001 | Bronner et al. |
| 6,271,602 B1 | 8/2001 | Ackmann et al. |
| 6,307,273 B1 | 10/2001 | Chien et al. |
| 6,413,383 B1 * | 7/2002 | Chiang et al. ......... 204/192.13 |
| 6,492,269 B1 | 12/2002 | Liu et al. |
| 6,528,386 B1 * | 3/2003 | Summerfelt et al. ........ 438/401 |
| 6,534,378 B1 * | 3/2003 | Ramkumar et al. ......... 438/401 |
| 6,562,691 B2 | 5/2003 | Chang et al. |
| 6,562,710 B2 * | 5/2003 | Nakagawa et al. ......... 438/619 |
| 6,599,809 B2 * | 7/2003 | Anma et al. ................ 438/401 |
| 6,949,839 B2 * | 9/2005 | Farrar et al. ................ 257/797 |

(Continued)

*Primary Examiner*—Andy Huynh
*Assistant Examiner*—David Goodwin
(74) *Attorney, Agent, or Firm*—James J. Cioffi; Kerry B. Goodwin

(57) ABSTRACT

A method for forming an alignment mark structure for a semiconductor device includes forming an alignment recess at a selected level of the semiconductor device substrate. A first metal layer is formed over the selected substrate level and within the alignment recess, wherein the alignment recess is formed at a depth such that the first metal layer only partially fills the alignment recess. A second metal layer is formed over the first metal layer such that the alignment recess is completely filled. The second metal layer and the first metal layer are then planarized down to the selected substrate level, thereby creating a sacrificial plug of the second layer material within the alignment recess. The sacrificial plug is removed in a manner so as not to substantially roughen the planarized surface at the selected substrate level.

13 Claims, 5 Drawing Sheets

U.S. PATENT DOCUMENTS

| | | |
|---|---|---|
| 6,972,209 B2 * | 12/2005 | Agarwala et al. ............. 438/52 |
| 6,979,526 B2 * | 12/2005 | Ning .......................... 430/314 |
| 2001/0010938 A1 | 8/2001 | Bronner et al. |
| 2001/0049177 A1 | 12/2001 | Nagai |
| 2002/0096775 A1 | 7/2002 | Ning |
| 2002/0098707 A1 * | 7/2002 | Ning .......................... 438/712 |
| 2004/0043579 A1 * | 3/2004 | Nuetzel et al. ............. 438/401 |
| 2005/0196951 A1 * | 9/2005 | Lin et al. .................... 438/622 |

* cited by examiner

PLANAR MAGNETIC TUNNEL JUNCTION SUBSTRATE HAVING RECESSED ALIGNMENT MARKS

TECHNICAL FIELD

The present invention relates generally to semiconductor device processing and, more particularly, to a method for forming recessed alignment marks for a planar magnetic tunnel junction substrate used in magnetic memory devices.

BACKGROUND ART

Magnetic (or magneto-resistive) random access memory (MRAM) is a non-volatile random access memory technology that could potentially replace the dynamic random access memory (DRAM) as the standard memory for computing devices. The use of MRAM as a non-volatile RAM will eventually allow for "instant on" systems that come to life as soon as the system is turned on, thus saving the amount of time needed for a conventional PC, for example, to transfer boot data from a hard disk drive to volatile DRAM during system power up.

A magnetic memory element (also referred to as a tunneling magneto-resistive, or TMR device) includes a structure having ferromagnetic layers separated by a non-magnetic layer (barrier), and arranged into a magnetic tunnel junction (MTJ). Digital information is stored and represented in the memory element as directions of magnetization vectors in the magnetic layers. More specifically, the magnetic moment of one magnetic layer (also referred to as a reference layer) is fixed or pinned, while the magnetic moment of the other magnetic layer (also referred to as a "free" layer) may be switched between the same direction and the opposite direction with respect to the fixed magnetization direction of the reference layer. The orientations of the magnetic moment of the free layer are also known as "parallel" and "antiparallel" states, wherein a parallel state refers to the same magnetic alignment of the free and reference layers, while an antiparallel state refers to opposing magnetic alignments therebetween.

Depending upon the magnetic state of the free layer (parallel or antiparallel), the magnetic memory element exhibits two different resistance values in response to a voltage applied across the tunnel junction barrier. The particular resistance of the TMR device thus reflects the magnetization state of the free layer, wherein resistance is "low" when the magnetization is parallel, and "high" when the magnetization is antiparallel. Accordingly, a detection of changes in resistance allows a MRAM device to provide information stored in the magnetic memory element (i.e., a read operation). In addition, a MRAM cell is written to through the application of a bi-directional current in a particular direction, in order to magnetically align the free layer in a parallel or antiparallel state.

MRAM devices, like semiconductor devices in general, are continually becoming smaller in size and require manufacturing processes that are capable of producing these devices. Alignment techniques are implemented during manufacturing processes in order to ensure correct alignment of the various layers within semiconductor devices. Typically, alignment marks are utilized in the layers to help align the various features.

In the context of MRAM devices, the MTJ stacks require extremely smooth substrates for deposition thereon, in order to create a near-planar tunnel barrier such that the very small coherence lengths of the spin-polarized electrons will be uniform across the device. Since this MTJ stack is non-transparent to light, the lithography on top of this layer requires topographic (rather than material contrast) features for alignment and overlay measurement through the layer. Because the underlying layer is typically chemically mechanically polished (CMP) as a final step before MTJ stack deposition, conventional alignment mark formation in this regard also typically leaves slurry residue from smoothing CMP operations within the alignment mark topography. Such residue particles are difficult to remove in a clean manner.

DISCLOSURE OF INVENTION

The foregoing discussed drawbacks and deficiencies of the prior art are overcome or alleviated by a method for forming topography with an alignment mark structure for a semiconductor device. In an exemplary embodiment, the method includes forming an alignment recess at a selected level of the semiconductor device substrate. A first metal layer is formed over the selected substrate level and within the alignment recess, wherein the alignment recess is formed at a depth such that the first metal layer only partially fills the alignment recess. A second metal layer is formed over the first metal layer such that the alignment recess is completely filled. The second metal layer and the first metal layer are then planarized down to the selected substrate level, thereby creating a sacrificial plug of the second layer material within the alignment recess. The sacrificial plug is removed in a manner so as not to substantially roughen the planarized surface at the selected substrate level.

BRIEF DESCRIPTION OF THE DRAWINGS

Referring to the exemplary drawings wherein like elements are numbered alike in the several Figures.

BEST MODE OF CARRYING OUT THE INVENTION

Disclosed herein is an improved method of forming alignment marks for a magnetic memory device. Briefly stated, the process includes the creation of a smooth planar surface suitable for the formation of magnetic tunnel junctions thereon, while at the same time creating recesses in the surface that enable straightforward alignment of lithography masks when opaque materials are deposited on the surface. Thereby, no additional lithography mask levels are used to implement this alignment feature. The process is inherently clean, with no residual slurry particles that can decrease device yield.

Although the exemplary embodiments described hereinafter are presented in the context of MRAM devices, it will be appreciated that the principles thereof are equally applicable to other types of integrated circuit devices and/or features (e.g., tunnel barriers, epitaxial films, etc.) that utilize extremely smooth substrates, and that also include topography in certain regions of the substrate to allow for lithographic alignment through opaque layers. Moreover, while the exemplary embodiments herein are specifically described in the context of a field effect transistor (FET) based magnetic memory element, it will further be appreciated that the principles are also applicable to crosspoint-style architectures for MRAM devices.

Figure 1:
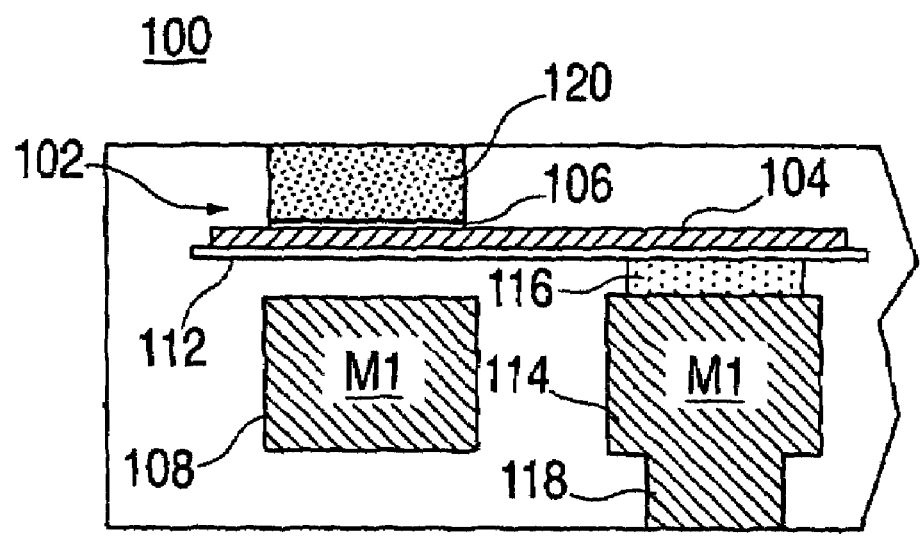
FIG. 1 is a cross sectional view of an FET-based MRAM device, suitable for use in accordance with an embodiment of the invention.

Referring initially to FIG. 1, there is shown (for purposes of background context) a cross sectional view of an FET-based MRAM device 100, suitable for use in accordance with an embodiment of the invention. More specifically, FIG. 1 illustrates a portion of an FET-based memory element 102 disposed between a lower metallization level and an upper metallization level (not shown). In the example depicted, the lower metallization level corresponds to the first metallization level (M1) of the MRAM device 100. However, one skilled in the art will recognize that the individual memory elements could also be formed upon other layers within the device 100 (e.g., upon M2, M3, etc.).

As is shown in FIG. 1, the memory element 102 includes an MTJ stack having a lower magnetic layer 104 with a non-magnetic layer (e.g., an oxide) and upper magnetic layer formed thereatop (shown collectively as layer 106). Although the cell 102 is located at a corresponding intersection between a wordline 108 and a bitline (not shown), the bottom portion of the cell 102 is not in direct electrical contact with wordline 108, unlike an XPC configuration. Instead, the cell 102 is formed atop metal strap 112, which serves to interconnect the cell 102 to lower level metallization line 114 through via stud 116. In turn, line 114 completes the connection of the cell 102 to an associated substrate-level access transistor (not shown) through contact area stud 118. A relatively thick metal hardmask 120 serves as an interconnect between the bitline (not shown) at an upper metallization level (not shown) and the top layer of cell 102.

Figure 2:
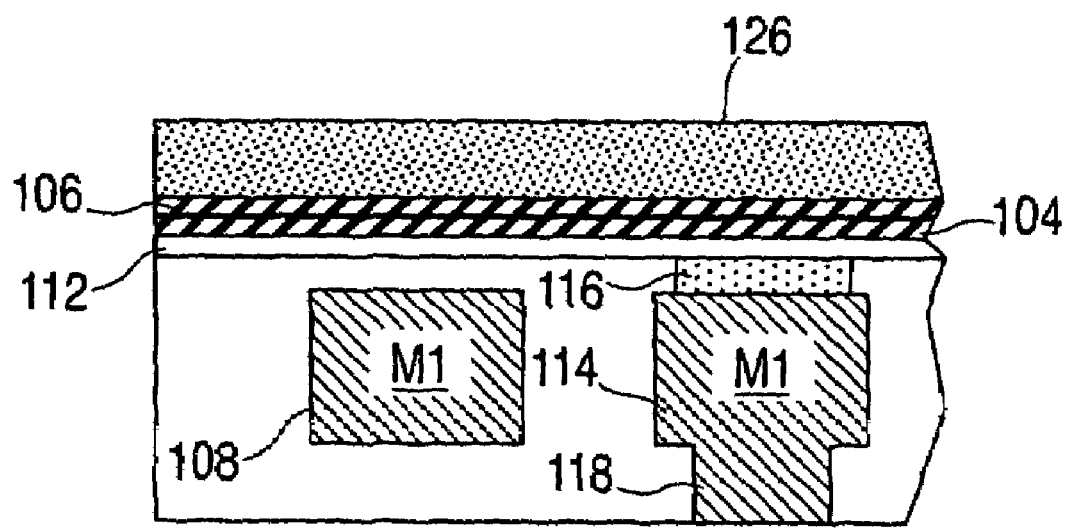
FIG. 2 is a cross sectional view of an earlier processing step with respect to the device of FIG. 1.

One problem associated with the memory element shown in FIG. 1 is that the MTJ stack is generally deposited as a blanket film, which then (for optimal performance and yield) requires lithography with very tight alignment tolerances so as to finely locate the MTJ device 102 with respect to the underlying features 108 or 116. The blanket film in many cases is opaque or highly reflective, and prevents lithography tools from seeing through to previous levels (e.g., M1 in the figure). Thus, the appropriate alignment tools have no reference pattern with which to align the MTJ element 102. FIG. 2 illustrates an earlier processing step with respect to FIG. 1, wherein the MTJ-protecting hardmask 120 has neither been etched, nor defined by lithography. Since the hardmask layer 126 used in forming hardmask 120 is metallic and opaque, for example, the lithography tools are prevented from "seeing through" to the via stud 116 or M1 levels, thereby preventing the hardmask pattern from being accurately aligned with respect to those previous levels.

Figure 3A:
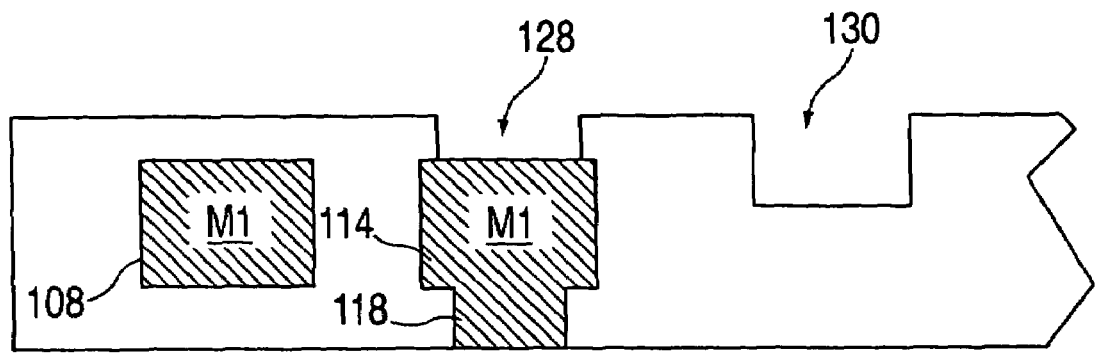
FIGS. 3(a)–3(d) illustrate a conventional alignment mark formation process in the context of an MRAM device.
Figure 3B:
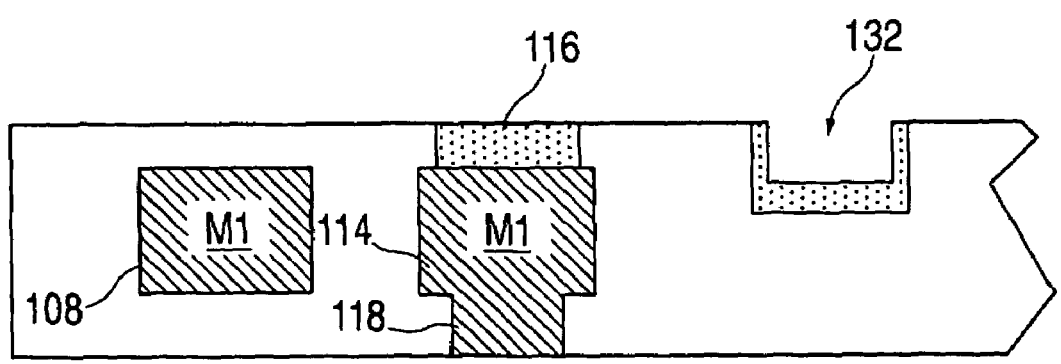

In situations such as this, one conventional method previously used to allow for alignment is to create surface topography (e.g., a recess therein, or a protrusion therefrom) that provides sufficient visual contrast so as to allow lithography tools to align to opaque layers. This conventional approach is described in FIGS. 3(a)–3(d). FIG. 3(a) illustrates the processing step of the MRAM device 100 in which a via opening 128 is defined for the via stud 116 (FIGS. 1, 2) connecting to M1. In addition, another recess 130 is defined within a region of the wafer that is not utilized for active devices (e.g., an alignment mark region). It will be noted that this "alignment" recess 130 is formed deeper than via 128. Thus, through suitable choice of metal fill for the recess 130, via 128 may be completely filled without entirely filling the entire alignment mark created by recess 130. This is shown in FIG. 3(b). As can be seen, a recess 132 remains in recess 130 that is subsequently suitable for alignment purposes after the hardmask metal film is deposited.

Figure 3C:
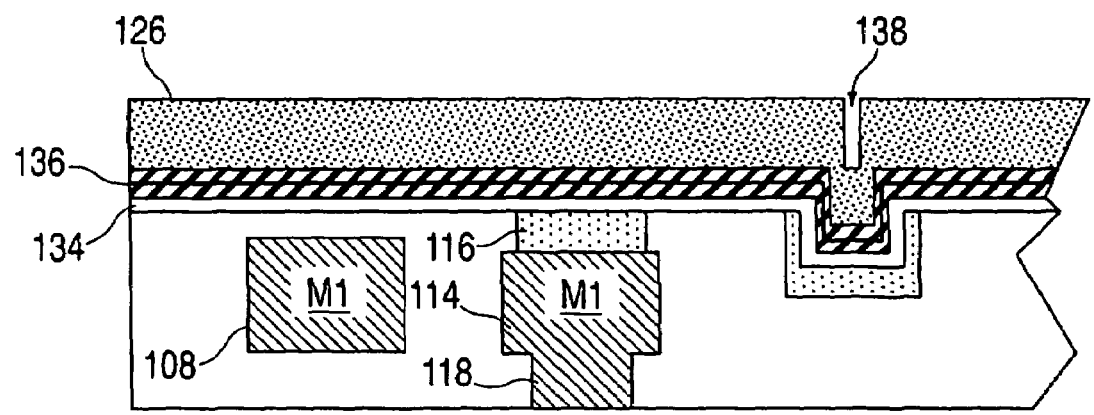
Figure 3D:
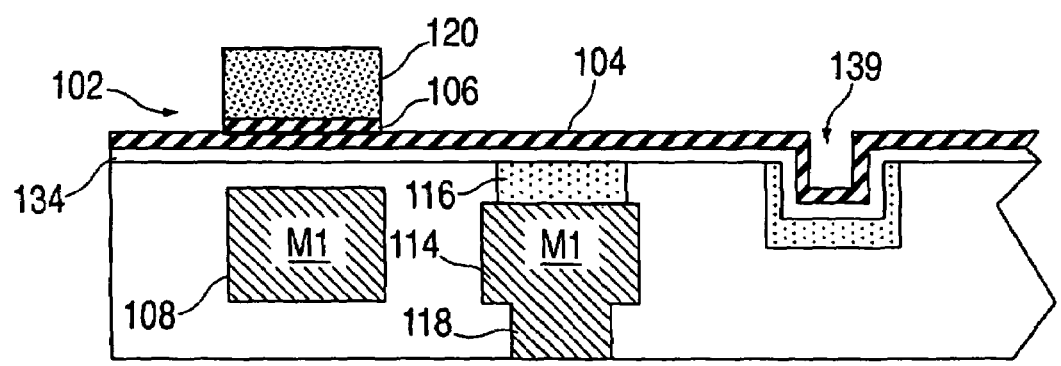

FIG. 3(c) illustrates the subsequent deposition of the metal strap, MTJ and hardmask layers (134, 136, 126, respectively) wherein a remaining recess 138 is still present by virtue of recess 132 and offers sufficient visual contrast to be utilized as an alignment feature. Then, as shown in FIG. 3(d), the MTJ hardmask 120 is patterned similar to FIG. 1, only with the residual recess feature 139 following the removal of the excess hardmask metal.

A significant drawback with respect to the conventional alignment mark formation process of FIGS. 3(a)–3(d) stems from the attempt to both create the initial alignment recess 130, and to leave behind an ultra-smooth surface (e.g., less than 10 Angstroms (Å) of roughness) suitable as a substrate for device elements such as magnetic tunnel junctions (i.e., the opaque blanket film). A first approach in creating the recess 130 of FIG. 3(a) is to define it at the same time as the definition of via 116 by overetch, for example. The via 116 is then filled with metal, and a chemical-mechanical planarization (CMP) step is performed to isolate the via 116 shape and leave behind an ultra-smooth surface. Alternatively, a second approach is to form the initial alignment recess 130 after via 116 is completely defined, filled and smoothed, through the use of an additional lithography mask and an additional etch step.

Unfortunately, in implementing the first approach, problems are generally encountered with CMP slurry residue that becomes trapped in the alignment mark recesses. The slurry particles are extremely difficult to remove in a clean manner, and may cause distortion of the edges of the alignment marks such that the lithography tools cannot align well. In addition, portions of the slurry residue may escape from the marks during subsequent processing steps (e.g., during a high-temperature process), thereby creating defects and yield loss for the circuits.

The second approach also suffers from its own drawbacks, particularly with respect to the expense in using an additional lithography level, as well as the difficulty in devising a suitable etch and resist removal process that does not also cause a roughening of the substrate by more than several Angstroms. As device ground rules decrease, and as memory arrays increase in density, it becomes increasingly more important to eliminate problems such as slurry trapping, and/or the expense and yield loss incurred by an extra lithography level. As is evident from above, it is desirable to provide a process wherein an ultra-smooth surface can be reliably created that also includes a recess suitable for alignment of future lithography levels.

Therefore, in accordance with an embodiment of the invention, there is disclosed a method for forming alignment structures through the use of an additional sacrificial metal to prevent slurry trapping during CMP, and an additional (gentle) etch step to remove the sacrificial metal after CMP without roughening the surface. The specific steps utilized are relatively straightforward, common processes that add very little to the expense of the device fabrication. Yet, when utilized in the particular manner described in the present invention, they lead to an ideal structure for the formation of sensitive elements made from opaque materials. Aspects of the present invention also have the advantage that one has much flexibility in the choice of metal used to prevent slurry trapping, and in the choice of etch to remove the sacrificial metal.

Figure 4A:
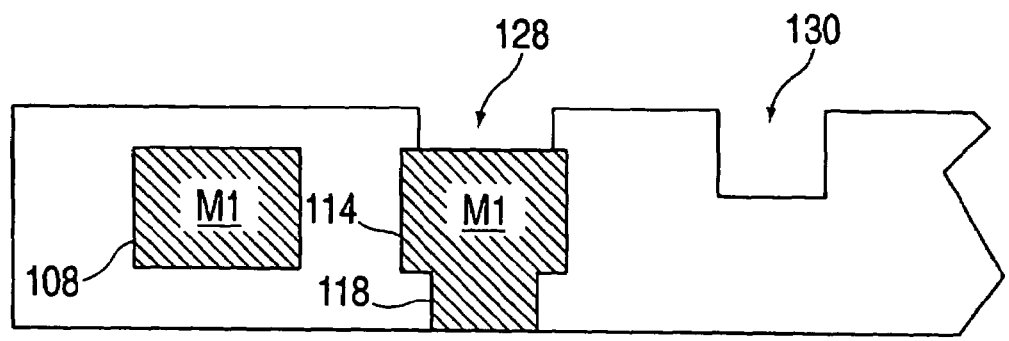
FIGS. 4(a)–4(d) illustrate a method for forming recessed alignment marks for a planar magnetic tunnel junction substrate, in accordance with an embodiment of the invention.

Referring now to FIG. 4(a), there is initially shown the processing step in which both via 116 and the initial alignment recess 130 have been formed, similar to FIG. 3(a). It should be re-emphasized at this point that the alignment formation techniques discussed hereinafter may be used at any relevant level in the production of an integrated circuit. Thus, while for illustrative purposes the alignment is fabricated just above the M1 metal level, it may also be formed at any other suitable location, at or above the wafer surface.

Figure 4B:
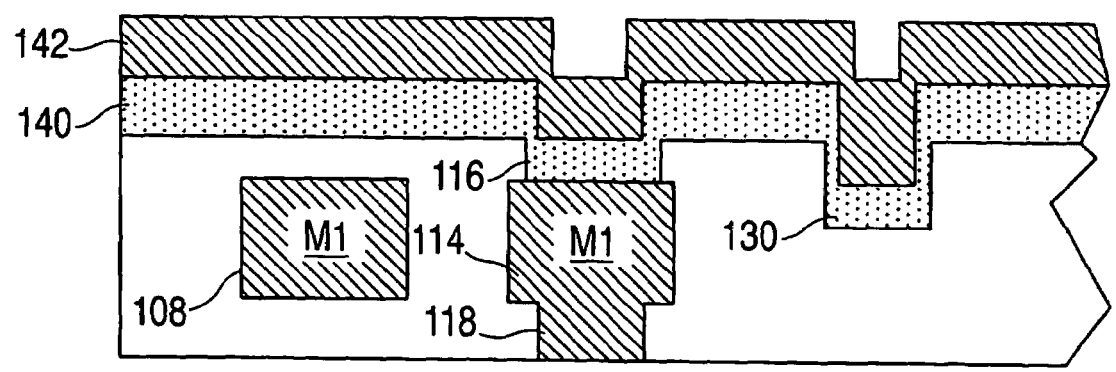

As shown in FIG. 4(b), the exemplary method embodiment uses an approach wherein the filling of metal in via 116 and the initial alignment recess 130 is carried out in a multilayer manner. A first metal layer 140 is used as the fill material for via 116, while a second metal layer 142 is deposited for use as a sacrificial plug for the subsequently formed alignment marks. Adhesion layers may also be deposited to ensure the sacrificial material (layer 142) adheres sufficiently well to the via metal fill (layer 140). The sacrificial material may be deposited by any number of means, including but not limited to, physical vapor deposition (PVD), chemical vapor deposition (CVD), plating, etc.

In an exemplary embodiment, the via 116 fill is tantalum nitride (TaN), while the sacrificial material 142 is a bilayer of thin Ta (for adhesion purposes), followed by copper. However, the sacrificial layer 142 may also be any number of materials (metals or dielectrics are both acceptable), and is not limited to those materials described in the exemplary embodiment so long as the sacrificial layer:(1) creates a reasonably conformal fill in the alignment marks, to prevent slurry trapping during CMP; (2) allows for a straightforward CMP of the material; and (3) can be removed with a gentle etch that does not roughen the surrounding dielectric surface.

Figure 4C:
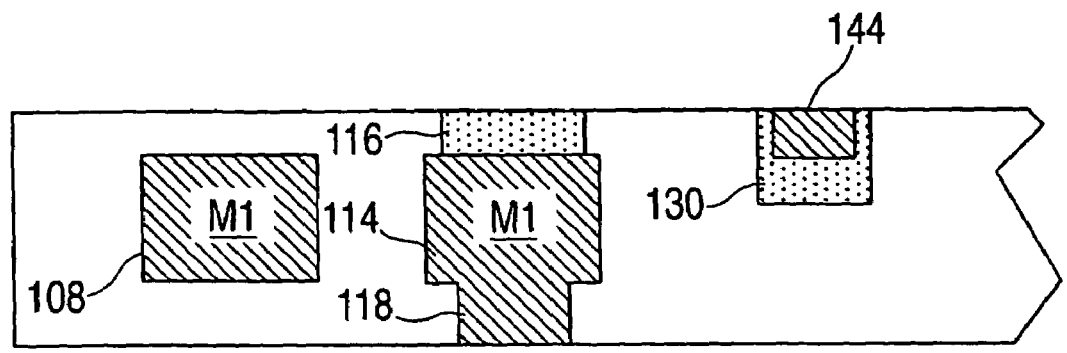

Following the deposition of the metal fill materials 140, 142, CMP is performed so to leave an ultra-smooth surface suitable for formation of sensitive circuit elements such as magnetic tunnel junctions. As shown in FIG. 4(c), the remaining sacrificial material forms a plug 144 in the alignment mark to prevent the trapping of slurry particles during CMP. In order to facilitate a successful CMP process in this manner, an exemplary preferred material selection for via 116 includes TaN, while the sacrificial plug 144 includes Cu/Ta. Again however, other choices for these materials may be used.

Figure 4D:
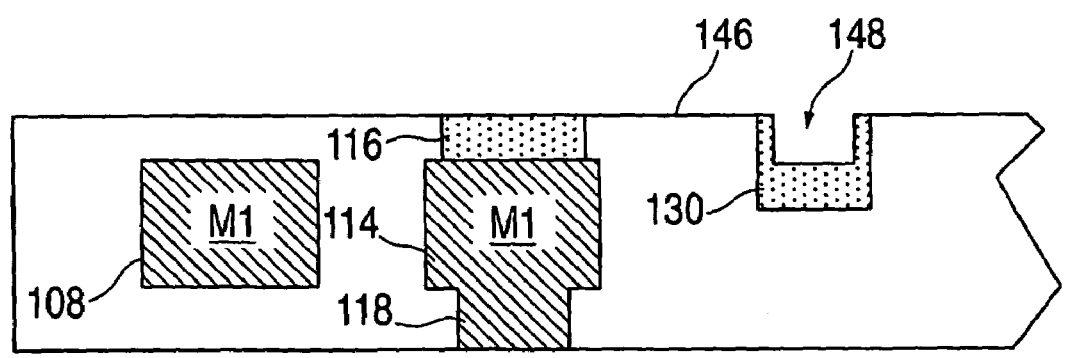

Finally, FIG. 4(d) illustrates the application of an etch to remove the sacrificial alignment mark plug 144. Through a suitable choice of material for the plug 144 as discussed above, the plug 144 may be removed with a gentle etch without causing a roughening of the active device surface 146 that would otherwise cause performance or yield loss in forming the sensitive devices. In the exemplary embodiment presented herein (with copper as the choice for the sacrificial plug 144), a suitable dielectric film (e.g., silicon nitride) is used as an insulator around via 116 such that it is insensitive to the etch used to remove the plug 144. Any gentle etch that can remove the copper from the formed alignment marks without harming the surface of the silicon nitride is suitable. This may include, but is not limited to, a dilute phosphoric acid etch, for example. Once the plug 144 is removed, a recessed alignment mark structure 148 is created, and deposition of the opaque films and subsequent alignment of the sensitive device features to the underlying features (with high accuracy) may continue in accordance with conventional processing methods.

As will be appreciated, the above described technique may be performed in a manner such that the particular sensitive element may be placed at numerous choices of location with respect to the silicon surface, and as such, the use of the terminology "M1" is not meant to restrict the sensitive element to locations just above the first wiring level above the silicon surface. Furthermore, while the described embodiment refers to magnetic memory elements that are formed on ultra-smooth substrates, the invention is not limited to magnetic memory elements. Rather, any device or film that requires smooth substrates and also is opaque to lithographic alignment may benefit from this methodology. In addition, while the exemplary embodiment also describes alignment and via features that are transposed horizontally with respect to the memory element, the process flow may also be utilized to enable processes with various other locations of the alignment features (including the combination of via and alignment functions into a single feature).

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

INDUSTRIAL APPLICABILITY

The present disclosure has industrial applicability in the area of semiconductor device processing and, in particular, to the formation of semiconductor memory devices such as magnetic random access memory (MRAM).

What is claimed is:

1. A method for forming an alignment mark structure (148) for a semiconductor device, the method comprising:
    forming a via passage (128) having a first depth at a selected level of a substrate of the semiconductor device;
    forming an alignment recess (130) having a second depth greater than the first depth at the selected level of the semiconductor device substrate;
    forming a first metal layer (140) over said selected substrate level, within said via passage and within said alignment recess (130), wherein said via passage (128) is at least substantially filled with the first metal layer (140), and wherein said alignment recess (130) is only partially filled by said first metal layer (140);
    forming a second metal layer (142) over said first metal layer (140) such that said alignment recess (130) is completely filled;
    planarizing said second metal layer (142) and said first metal layer (140) down to said selected substrate level, thereby creating a sacrificial plug (144) of said second layer material within said alignment recess; and
    removing said sacrificial plug (144) in a manner so as not to substantially roughen the planarized surface at said selected substrate level.

2. The method of claim 1, wherein said second metal layer (142) has an etch selectivity with respect to said first metal layer (140).

3. The method of claim 2, wherein said second metal layer (142) further has an etch selectivity with respect to a dielectric material surrounding said alignment recess (130).

4. The method of claim 2, wherein:
said first metal layer (140) comprises tantalum nitride; and
second metal layer (142) is a sacrificial bilayer of tantalum and copper.

5. The method of claim 2, further comprising depositing an adhesion layer for adhering said second metal layer (142) to said first metal layer (140).

6. The method of claim 2, wherein said second metal layer (142) is deposited by one of: physical vapor deposition (PVD), chemical vapor deposition (CVD), and plating.

7. The method of claim 2, wherein said sacrificial plug (144) is removed with a dilute phosphoric acid etch.

8. The method of claim 1, wherein the semiconductor device comprises a magnetic random access memory (MRAM).

9. The method of claim 8, wherein the MRAM is a field effect transistor (FET) based MRAM device (102).

10. The method of claim 8, wherein said via passage (128) forms a via (116) used to connect a metal strap (112) of the MRAM device to a lower metallization level line (114) of the MRAM device.

11. The method of claim 10, wherein: said selected level of the device is a level at which said metal strap (112) is defined; and the material used to form said metal strap (112) is metallic and opaque.

12. The method of claim 10, wherein said alignment recess (130) is defined simultaneously with said via (116), and said alignment recess (130) is fully formed by an overetch.

13. The method of claim 10, wherein said alignment recess (130) is defined subsequent to the formation of said via (116).

* * * * *